(12) United States Patent
Wei et al.

(10) Patent No.: US 11,980,081 B2
(45) Date of Patent: May 7, 2024

(54) DISPLAY DEVICE, METHOD FOR MANUFACTURING DISPLAY DEVICE, HEAT DISSIPATION LAYER, AND ELECTRONIC DEVICE

(71) Applicant: BOE Technology Group Co., Ltd., Beijing (CN)

(72) Inventors: Junbo Wei, Beijing (CN); Shengji Yang, Beijing (CN); Kuanta Huang, Beijing (CN); Pengcheng Lu, Beijing (CN); Yuanlan Tian, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 951 days.

(21) Appl. No.: 16/966,718

(22) PCT Filed: Aug. 27, 2019

(86) PCT No.: PCT/CN2019/102866
§ 371 (c)(1),
(2) Date: Jul. 31, 2020

(87) PCT Pub. No.: WO2021/035538
PCT Pub. Date: Mar. 4, 2021

(65) Prior Publication Data
US 2023/0172037 A1     Jun. 1, 2023

(51) Int. Cl.
*H10K 59/80*     (2023.01)
*G09G 3/3266*     (2016.01)
(Continued)

(52) U.S. Cl.
CPC ....... *H10K 59/8794* (2023.02); *G09G 3/3266* (2013.01); *G09G 3/3275* (2013.01);
(Continued)

(58) Field of Classification Search
None
See application file for complete search history.

(56) References Cited

U.S. PATENT DOCUMENTS

| 7,218,521 B2 | 5/2007 | Kim |
| 9,129,920 B2 | 9/2015 | Masumoto et al. |

(Continued)

FOREIGN PATENT DOCUMENTS

| CN | 1538487 A | 10/2004 |
| CN | 1603890 A * | 4/2005 |

(Continued)

OTHER PUBLICATIONS

Jul. 21, 2022—(EP) Partial European Search Report No. 19933220.6.

(Continued)

*Primary Examiner* — Michael Lebentritt
(74) *Attorney, Agent, or Firm* — Banner & Witcoff, Ltd.

(57) ABSTRACT

A display device, a heat dissipation layer, an electronic device, and a method for manufacturing a display device are provided. The display device includes: a silicon-based organic light-emitting display panel, including a silicon substrate, a first electrode of a display element, an organic light-emitting layer, and a second electrode of the display element that are stacked sequentially; a flexible printed circuit board electrically connected to the silicon substrate; and a heat dissipation layer on a non-display side of the silicon-based organic light-emitting display panel, extending to the flexible printed circuit board to cover at least a part of the flexible printed circuit board. A gate drive circuit, a data drive circuit, and a pixel circuit are integrated on the silicon substrate, and the flexible printed circuit board is configured (Continued)

to transmit electrical signals to the gate drive circuit, the data drive circuit, and the second electrode of the display element.

17 Claims, 8 Drawing Sheets

(51) Int. Cl.
    *G09G 3/3275* (2016.01)
    *H05K 1/18* (2006.01)
    *H05K 7/20* (2006.01)
    *H10K 71/00* (2023.01)

(52) U.S. Cl.
    CPC ......... *H05K 1/189* (2013.01); *H05K 7/20963* (2013.01); *H10K 59/873* (2023.02); *H10K 71/00* (2023.02); *G09G 2310/0278* (2013.01); *H05K 2201/10128* (2013.01)

(56) References Cited

U.S. PATENT DOCUMENTS

| | | | |
|---|---|---|---|
| 11,211,589 B2 | 12/2021 | Kristal | |
| 2011/0211139 A1* | 9/2011 | Itoh | G02F 1/13452 349/60 |
| 2013/0207946 A1 | 8/2013 | Kim et al. | |
| 2014/0131693 A1 | 5/2014 | Masumoto et al. | |
| 2016/0209133 A1 | 7/2016 | Hu et al. | |
| 2018/0145278 A1 | 5/2018 | Zhai | |
| 2021/0407411 A1* | 12/2021 | Yang | G09G 3/3258 |
| 2022/0173247 A1* | 6/2022 | Hanada | H01L 29/78618 |

FOREIGN PATENT DOCUMENTS

| | | | | |
|---|---|---|---|---|
| CN | 1665383 A | | 9/2005 | |
| CN | 202816948 U | | 3/2013 | |
| CN | 104754913 A | | 7/2015 | |
| CN | 205303466 U | | 6/2016 | |
| CN | 207531248 U | | 6/2018 | |
| CN | 108878674 A | | 11/2018 | |
| CN | 109802055 A | | 5/2019 | |
| CN | 107688253 B | * | 2/2022 | G09J 127/18 |
| JP | 2022099283 A | * | 7/2022 | G09G 3/3266 |
| WO | WO-2013118616 A1 | * | 8/2013 | G02B 6/009 |
| WO | WO-2021030971 A1 | * | 2/2021 | H01L 25/18 |

OTHER PUBLICATIONS

Aug. 2, 2022—(CN) First Chinese Office Action Appn 201980001507.X with English Translation.

* cited by examiner

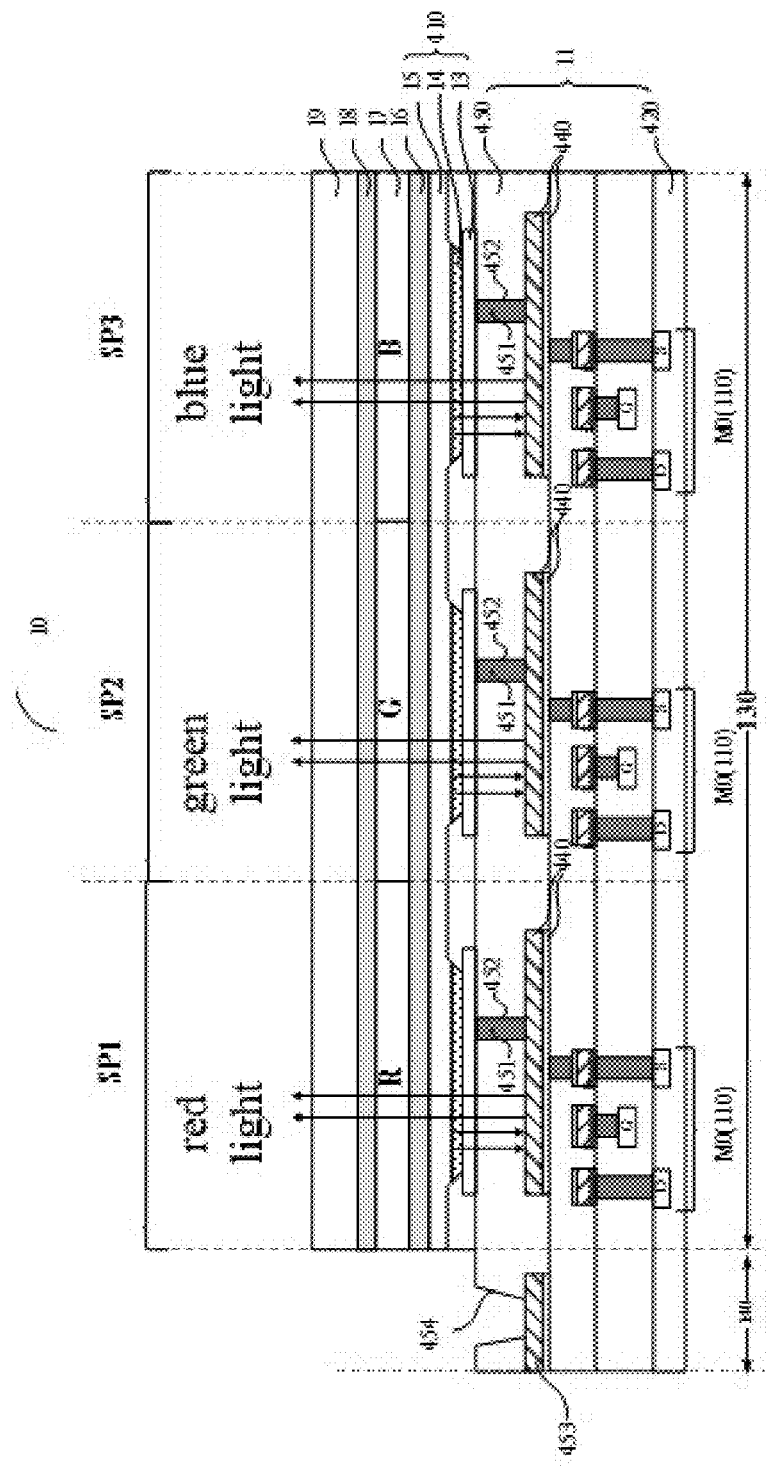

DISPLAY DEVICE, METHOD FOR MANUFACTURING DISPLAY DEVICE, HEAT DISSIPATION LAYER, AND ELECTRONIC DEVICE

This application is a U.S. National Phase Entry of International Application No. PCT/CN2019/102866 filed on Aug. 27, 2019, designating the United States of America. The present application claims priority to and the benefit of the above-identified application and the above-identified application is incorporated by reference herein in its entirety.

TECHNICAL FIELD

Embodiments of the present disclosure relate to a display device, a method for manufacturing a display device, a heat dissipation layer, and an electronic device.

BACKGROUND

Micro organic light-emitting diode (Micro-OLED) display device is a new type of OLED display device which adopts a silicon substrate as a base substrate, and is also called a silicon-based organic light-emitting diode (silicon-based OLED) display device. The silicon-based OLED display device has advantages of small size and high resolution, and can be manufactured by using a mature CMOS integrated circuit process. The silicon-based OLED display device can realize active addressing of pixels, various functional circuits can be manufactured on a silicon-based substrate, such as a timing control (TCON) circuit, an over current protection (OCP) circuit, etc., and light weight can be achieved.

SUMMARY

At least one embodiment of the present disclosure provides a display device, and the display device comprises a silicon-based organic light-emitting display panel, a flexible printed circuit board, and a heat dissipation layer. The silicon-based organic light-emitting display panel comprises a silicon substrate, a first electrode of a display element, an organic light-emitting layer, and a second electrode of the display element that are stacked sequentially. The flexible printed circuit board is electrically connected to the silicon substrate. The heat dissipation layer is on a non-display side of the silicon-based organic light-emitting display panel and extends to the flexible printed circuit board to cover at least a part of the flexible printed circuit board. A gate drive circuit, a data drive circuit, and a pixel circuit are integrated on the silicon substrate, and the flexible printed circuit board is configured to transmit electrical signals to the gate drive circuit, the data drive circuit, and the second electrode of the display element.

For example, in the display device provided by at least one embodiment of the present disclosure, the heat dissipation layer comprises a first heat dissipation layer, a second heat dissipation layer, and a third heat dissipation layer. The first heat dissipation layer is on the non-display side of the silicon-based organic light-emitting display panel. The second heat dissipation layer is on a side of the first heat dissipation layer away from the silicon-based organic light-emitting display panel. An area of an orthographic projection of the second heat dissipation layer on a plane parallel to the first heat dissipation layer is smaller than an area of an orthographic projection of the first heat dissipation layer on the plane, and the orthographic projection of the second heat dissipation layer on the plane is within the orthographic projection of the first heat dissipation layer on the plane. The third heat dissipation layer is on a side of the second heat dissipation layer away from the first heat dissipation layer and covers all surfaces, that are not in contact with the first heat dissipation layer, of the second heat dissipation layer.

For example, in the display device provided by at least one embodiment of the present disclosure, a material of the second heat dissipation layer is metal particles or a phase change material.

For example, in the display device provided by at least one embodiment of the present disclosure, the metal particles comprise copper metal particles, copper alloy metal particles, silver metal particles, silver alloy metal particles, aluminum metal particles, or aluminum alloy metal particles.

For example, in the display device provided by at least one embodiment of the present disclosure, the phase change material comprises liquid metal.

For example, in the display device provided by at least one embodiment of the present disclosure, the liquid metal comprises alloys of one or more selected from the group consisting of gallium, indium, rubidium, and cesium.

For example, in the display device provided by at least one embodiment of the present disclosure, a material of the first heat dissipation layer and a material of the second heat dissipation layer are metal.

For example, in the display device provided by at least one embodiment of the present disclosure, the metal comprises copper, copper alloy, silver, silver alloy, aluminum, or aluminum alloy.

For example, in the display device provided by at least one embodiment of the present disclosure, a thermal conductivity of the second heat dissipation layer is greater than a thermal conductivity of the first heat dissipation layer, or the thermal conductivity of the second heat dissipation layer is greater than a thermal conductivity of the third heat dissipation layer.

For example, in the display device provided by at least one embodiment of the present disclosure, the heat dissipation layer further comprises an adhesive layer between the first heat dissipation layer and the silicon-based organic light-emitting display panel.

For example, in the display device provided by at least one embodiment of the present disclosure, the flexible printed circuit board comprises a first surface and a second surface that are opposite to each other, an end portion of the first surface of the flexible printed circuit board is connected to a display side of the silicon-based organic light-emitting display panel, and the heat dissipation layer extends to a portion, which is not connected to the silicon-based organic light-emitting display panel, of the first surface of the flexible printed circuit board via a side wall of the silicon-based organic light-emitting display panel.

For example, in the display device provided by at least one embodiment of the present disclosure, the heat dissipation layer extends from a non-display side of the silicon substrate to cover at least 30% of an area of the flexible printed circuit board.

For example, in the display device provided by at least one embodiment of the present disclosure, the silicon-based organic light-emitting display panel comprises a display region and a peripheral region surrounding the display region, and the display element is in the display region; and an orthographic projection of the heat dissipation layer on a plane parallel to the silicon-based organic light-emitting display panel at least partially overlaps with an orthographic projection of the display region on the plane.

For example, in the display device provided by at least one embodiment of the present disclosure, a width of the flexible printed circuit board is smaller than a width of the silicon substrate.

For example, in the display device provided by at least one embodiment of the present disclosure, the silicon-based organic light-emitting display panel further comprises a first thin film encapsulation layer, a second thin film encapsulation layer, a color film layer, and a cover plate. The first thin film encapsulation layer and the second thin film encapsulation layer are sequentially arranged on a side of the second electrode of the display element away from the organic light-emitting layer. The color film layer is between the first thin film encapsulation layer and the second thin film encapsulation layer. The cover plate is on a side of the second thin film encapsulation layer away from the color film layer.

At least one embodiment of the present disclosure also provides an electronic device which comprises the display device provided by any one of the embodiments of the present disclosure. The electronic device is a virtual reality device or an augmented reality device.

At least one embodiment of the present disclosure also provides a heat dissipation layer, which comprises a first heat dissipation layer, a second heat dissipation layer, and a third heat dissipation layer. The second heat dissipation layer is on the first heat dissipation layer. An area of an orthographic projection of the second heat dissipation layer on a plane parallel to the first heat dissipation layer is smaller than an area of an orthographic projection of the first heat dissipation layer on the plane, and the orthographic projection of the second heat dissipation layer on the plane is within the orthographic projection of the first heat dissipation layer on the plane. The third heat dissipation layer is on a side of the second heat dissipation layer away from the first heat dissipation layer and covers all surfaces, that are not in contact with the first heat dissipation layer, of the second heat dissipation layer.

For example, in the heat dissipation layer provided by at least one embodiment of the present disclosure, a material of the second heat dissipation layer is metal particles or a phase change material.

For example, in the heat dissipation layer provided by at least one embodiment of the present disclosure, the metal particles comprise copper metal particles, copper alloy metal particles, silver metal particles, silver alloy metal particles, aluminum metal particles, or aluminum alloy metal particles.

For example, in the heat dissipation layer provided by at least one embodiment of the present disclosure, the phase change material comprises liquid metal.

For example, in the heat dissipation layer provided by at least one embodiment of the present disclosure, the liquid metal comprises alloys of one or more selected from the group consisting of gallium, indium, rubidium, and cesium.

For example, in the heat dissipation layer provided by at least one embodiment of the present disclosure, a material of the first heat dissipation layer and a material of the second heat dissipation layer are metal.

For example, in the heat dissipation layer provided by at least one embodiment of the present disclosure, the metal comprises copper, copper alloy, silver, silver alloy, aluminum, or aluminum alloy.

For example, in the heat dissipation layer provided by at least one embodiment of the present disclosure, a thermal conductivity of the second heat dissipation layer is greater than a thermal conductivity of the first heat dissipation layer, or the thermal conductivity of the second heat dissipation layer is greater than a thermal conductivity of the third heat dissipation layer.

At least one embodiment of the present disclosure also provides a method for manufacturing a display device. The method comprises: providing a silicon-based organic light-emitting display panel; connecting a flexible printed circuit board to the silicon-based organic light-emitting display panel; and forming a heat dissipation layer on a non-display side of the silicon-based organic light-emitting display panel, and extending the heat dissipation layer to the flexible printed circuit board to cover at least a part of the flexible printed circuit board.

For example, in the method for manufacturing the display device provided by at least one embodiment of the present disclosure, forming the heat dissipation layer on the non-display side of the silicon-based organic light-emitting display panel, and extending the heat dissipation layer to the flexible printed circuit board to cover at least the part of the flexible printed circuit board, comprises: forming a first heat dissipation layer on the non-display side of the silicon-based organic light-emitting display panel by using an evaporation process or an electroforming method; forming a second heat dissipation layer on the first heat dissipation layer, an orthographic projection of the second heat dissipation layer on a plane parallel to the first heat dissipation layer being smaller than an orthographic projection of the first heat dissipation layer on the plane; and forming a third heat dissipation layer on the second heat dissipation layer by using the evaporation process or the electroforming method, and allowing the third heat dissipation layer to cover all surfaces, that are not in contact with the first heat dissipation layer, of the second heat dissipation layer.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

FIG. 6B is a schematic partial cross-sectional view of a silicon-based organic light-emitting display panel provided by at least one embodiment of the present disclosure;

DETAILED DESCRIPTION

Figure 1:
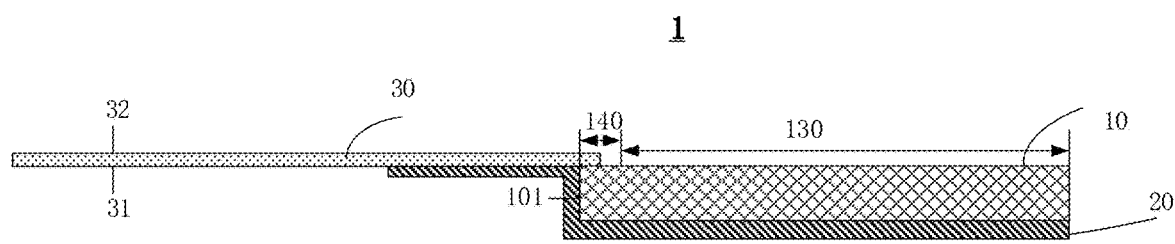
FIG. 1 is a schematic cross-sectional view of a display device provided by at least one embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Currently, the silicon-based OLED display devices are widely used in the field of near-eye display, such as virtual reality (VR) or augmented reality (AR), especially in AR/VR head-mounted display devices. In the case where the silicon-based OLED display device is used in a near-eye display device, because the temperature of the display device directly determines the user's experience, the heat dissipation of the display device is very important.

On the one hand, the current silicon-based OLED display device does not have a specific heat dissipation design scheme, the heat dissipation is implemented only by setting a thermal interface and connecting the thermal interface to the whole machine. However, this heat dissipation solution is only applicable to the heat dissipation of the whole head-mounted display device, but is not applicable to the heat dissipation of a separate display device. On the other hand, the silicon-based OLED display device generates a large amount of heat when operating for a long time, that is, the light-emitting layer of the silicon-based OLED display device generates a large amount of heat during the light emission process, so that the temperature of the silicon-based OLED display device increases. The temperature change of the silicon-based OLED display device may cause change in display brightness, which may cause problems of non-uniformity display and life-span attenuation of the display device, thereby affecting the display quality.

In view of the above problems, at least one embodiment of the present disclosure provides a display device. The display device comprises a silicon-based organic light-emitting display panel, a flexible printed circuit board, and a heat dissipation layer. The silicon-based organic light-emitting display panel comprises a silicon substrate, a first electrode of a display element, an organic light-emitting layer, and a second electrode of the display element that are stacked sequentially. The flexible printed circuit board is electrically connected to the silicon substrate. The heat dissipation layer is on a non-display side of the silicon-based organic light-emitting display panel and extends to the flexible printed circuit board to cover at least a part of the flexible printed circuit board. A gate drive circuit, a data drive circuit, and a pixel circuit are integrated on the silicon substrate, and the flexible printed circuit board is configured to transmit electrical signals to the gate drive circuit, the data drive circuit, and the second electrode of the display element.

Some embodiments of the present disclosure also provide an electronic device corresponding to the above display device and a method of manufacturing the display device.

According to the display device provided by the above embodiments of the present disclosure, on the one hand, in the display device, by setting the heat dissipation layer on the non-display side of the silicon-based organic light-emitting display panel and allowing the heat dissipation layer to extend to the flexible printed circuit board to cover at least a part of the flexible printed circuit board, the heat dissipation of the silicon-based organic light-emitting display panel and the flexible printed circuit board can be realized, thereby preventing the influence of the temperature change of the silicon-based organic light-emitting diode in the silicon-based organic light-emitting display panel due to insufficient heat dissipation on the display brightness and display life of the display device, improving the display quality of the display device, and prolonging the service life of the display device. On the other hand, in the display device, the heat dissipation layer and the silicon-based OLED display device are integrated together, the manufacturing process is simple, the compactness of the display device is improved, and the manufacturing cost of the display device is greatly reduced.

The embodiments and examples of the present disclosure are described in detail below with reference to the accompany drawings.

At least one embodiment of the present disclosure provides a display device. For example, the display device is a silicon-based OLED display device, which can be applied to a virtual reality device or an augmented reality device. Of course, the display device can also be other types of display devices. The embodiments of the present disclosure are not limited in this aspect.

Figure 2:
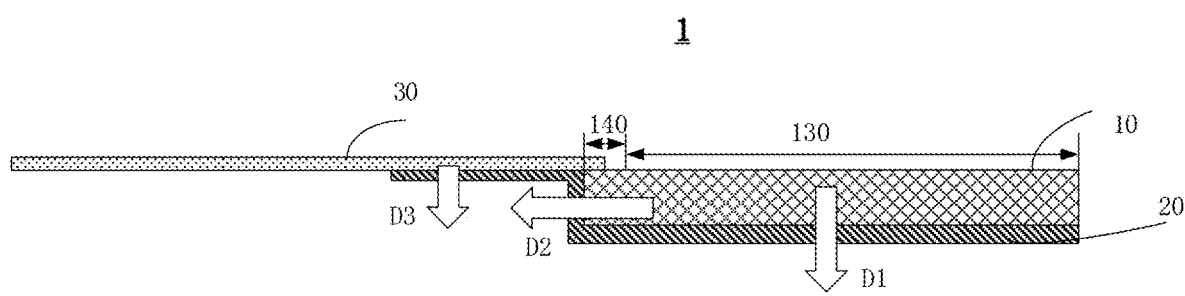
FIG. 2 is a schematic diagram of heat dissipation of a display device provided by at least one embodiment of the present disclosure.

FIG. 1 is a schematic cross-sectional view of a display device provided by at least one embodiment of the present disclosure, and FIG. 2 is a schematic diagram of heat dissipation of a display device provided by at least one embodiment of the present disclosure. The display device provided by at least one embodiment of the present disclosure is described in detail below with reference to FIG. 1 and FIG. 2.

As illustrated in FIG. 1, a display device 1 includes: a silicon-based organic light-emitting display panel 10, a heat dissipation layer 20, and a flexible printed circuit (FPC) board 30.

Figure 6A:
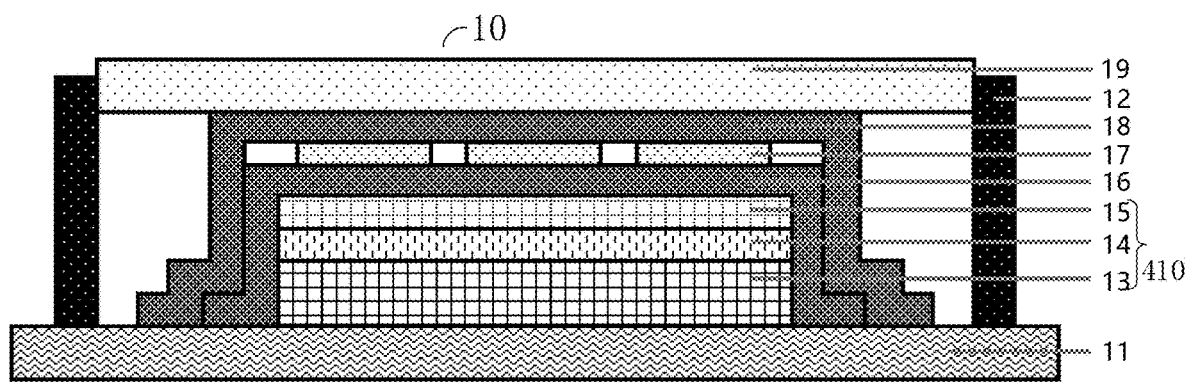
FIG. 6A is a schematic diagram of a silicon-based organic light-emitting display panel provided by at least one embodiment of the present disclosure.

For example, as illustrated in FIG. 6A, the silicon-based organic light-emitting display panel 10 includes a silicon substrate 11, a first electrode 13 of a display element 410, an organic light-emitting layer 14, and a second electrode 15 of the display element 410 that are sequentially stacked. The specific description of the silicon-based organic light-emitting display panel 10 is described in detail below, and is not repeated here.

For example, the heat dissipation layer 20 is on a non-display side of the silicon-based organic light-emitting display panel 10 (for example, the lower side of the silicon-based organic light-emitting display panel 10 illustrated in FIG. 1, i.e., the side opposite to a display surface of the silicon-based organic light-emitting display panel 10), and extends to the flexible printed circuit board 30 to cover at least a part of the flexible printed circuit board 30. For example, the flexible printed circuit board 30 includes a first surface 31 and a second surface 32 that are opposed to each other, and an end portion of the first surface 31 of the flexible printed circuit board 30 is connected to a display side of the silicon-based organic light-emitting display panel 10. The heat dissipation layer 20 extends to a portion, that is not connected to the silicon-based organic light-emitting display panel 10, of the first surface 31 of the flexible printed circuit board 30 via a side wall 101 of the silicon-based organic light-emitting display panel 10.

For example, as illustrated in FIG. 1 or FIG. 2, the heat dissipation layer 20 extends from a non-display side of the silicon substrate 11 to cover at least 30% of the area of the flexible printed circuit board 30, so that the heat dissipation of the silicon-based organic light-emitting display panel 10 as well as the heat dissipation of the flexible printed circuit board 30 can be achieved, thereby improving the heat dissipation effect of the display device. For example, as illustrated in FIG. 2, the heat generated by the display device 1 can be dissipated through the paths D1, D2, and D3 illustrated in FIG. 2, so as to achieve effective heat transfer of the silicon-based OLED display device, thereby reducing the temperature of the silicon-based OLED display element, prolonging the service life of the silicon-based OLED display element, and improving the display quality of the display device.

For example, in some other examples, the heat dissipation layer 20 not only covers the lower side and the left side of the silicon-based organic light-emitting display panel 10, but also covers the right side of the silicon-based organic light-emitting display panel 10, so that the heat generated by the silicon-based OLED display device can also be dissipated from the right side other than the path D1 (for example, the lower side of the silicon substrate) and the path D2 (for example, the left side of the silicon substrate), so as to improve the heat dissipation effect of the display device. The embodiments of the present disclosure are not limited in this aspect.

For example, the flexible printed circuit board 30 is electrically connected to the silicon-based organic light-emitting display panel 10 (for example, the silicon substrate 11 in the silicon-based organic light-emitting display panel 10), for example, electrically connected to the peripheral region of the silicon-based organic light-emitting display panel 10, so as to provide a driving signal to the silicon-based organic light-emitting display panel 10 to drive the silicon-based organic light-emitting display panel 10 to emit light. For example, the driving signal here may include at least one of a data signal or a power signal.

For example, in some examples, as illustrated in FIG. 1, the silicon-based organic light-emitting display panel 10 includes a display region 130 and a peripheral region 140 surrounding the display region 130. The display region 130 includes a plurality of display elements for display. For example, as illustrated in FIG. 6F, an orthographic projection 211 of the heat dissipation layer 20 on a plane parallel to the silicon-based organic light-emitting display panel 10 at least partially overlaps with an orthographic projection of the display region 130 on the plane, so that the heat generated by the display element during the light emission process can be dissipated in real time, which prevents the influence of the temperature change of the silicon-based organic light-emitting diode in the silicon-based organic light-emitting display panel due to insufficient heat dissipation on the display brightness and display life of the display device, improves the display quality of the display device, and prolongs the service life of the display device.

Figure 6C:
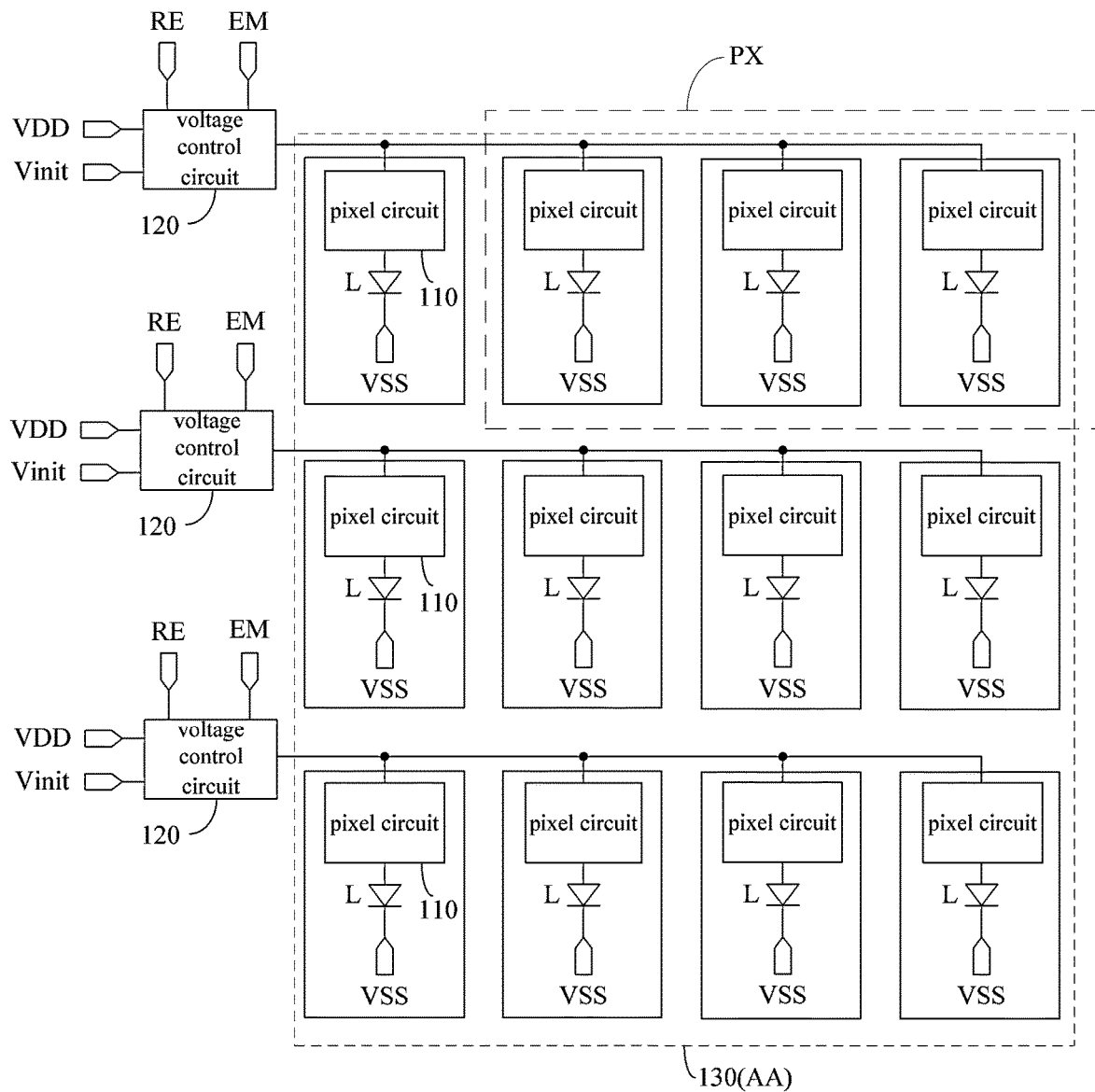
FIG. 6C is a schematic diagram of a circuit principle of a silicon-based organic light-emitting display panel provided by at least one embodiment of the present disclosure.
Figure 6D:
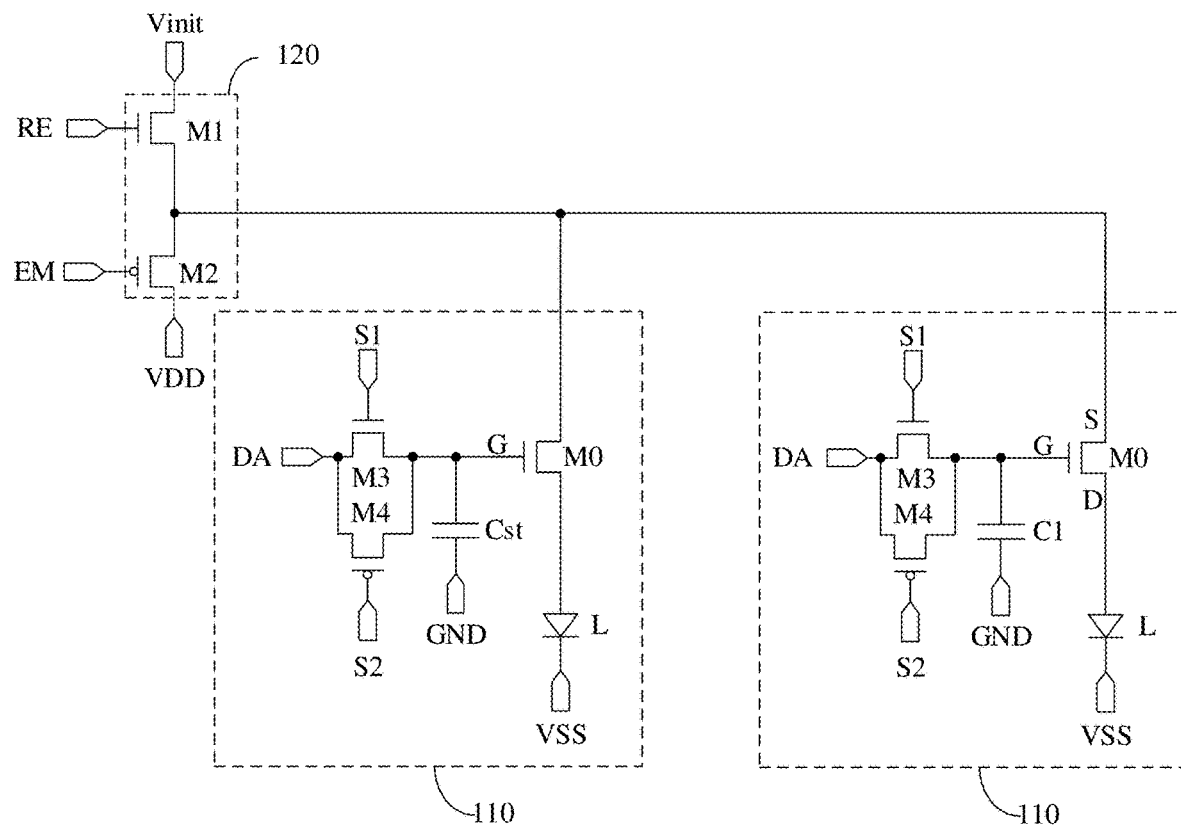
FIG. 6D is a circuit diagram of a specific implementation example of a voltage control circuit and a pixel circuit of a silicon-based organic light-emitting display panel provided by at least one embodiment of the present disclosure.
Figure 6E:
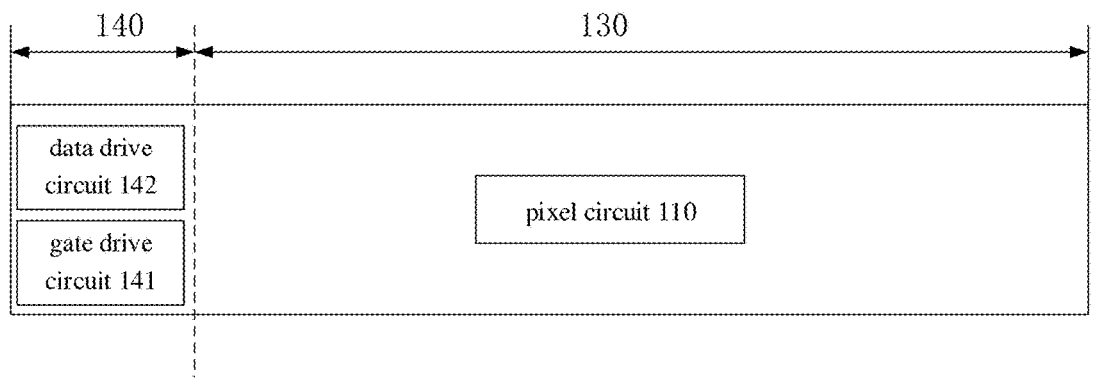
FIG. 6E is a schematic diagram of a silicon substrate provided by at least one embodiment of the present disclosure.
Figure 6F:
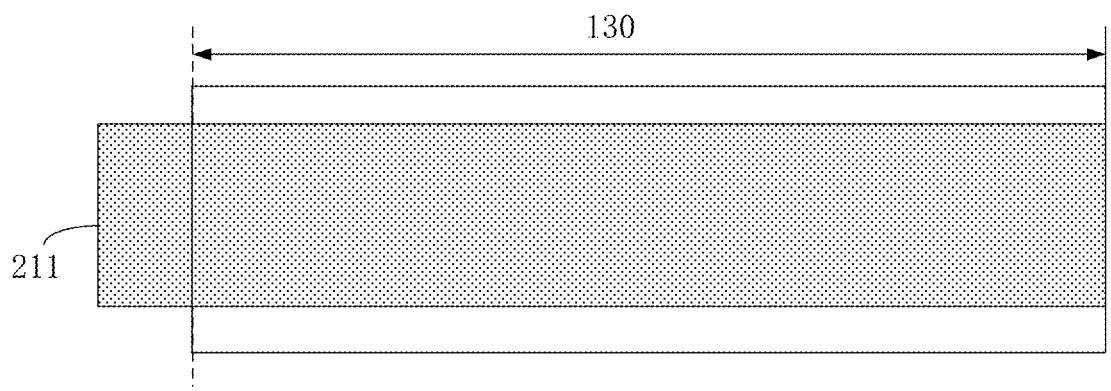
FIG. 6F is a schematic projection diagram provided by at least one embodiment of the present disclosure.

It should be noted that the orthographic projection 211 of the heat dissipation layer 20 on the plane parallel to the silicon-based organic light-emitting display panel 10 is not limited to the pattern illustrated in FIG. 6F, but may also have other regular or irregular patterns, such as a convex shape, and the embodiments of the present disclosure are not limited thereto.

For example, a width of the flexible printed circuit board 30 (for example, the length in a direction perpendicular to the direction in which the flexible printed circuit board 30 extends outward from the silicon substrate) is smaller than a width of the silicon substrate 11, and thus, for example, as illustrated in FIG. 6F, the orthographic projection of the heat dissipation layer 20 on this plane is narrower than the orthographic projection of the silicon-based organic light-emitting display panel 10 on this plane. For example, the position of the heat dissipation layer 20 corresponds to the silicon-based organic light-emitting display panel 10 and the flexible printed circuit board 30, and the heat dissipation layer 20 is integrated or adhered under the silicon-based organic light-emitting display panel 10 and the flexible printed circuit board 30, so that the heat dissipation of the silicon-based OLED display panel 10 and the heat dissipation of the flexible printed circuit board 30 can be effectively realized. For example, the size of the heat dissipation layer 20 is slightly smaller than the size of the silicon-based OLED display panel 10 and the flexible printed circuit board 30, so that the influence of the large size of the heat dissipation layer 20 on the size of the display device 1 can be avoided, which may limit the application scenario thereof. In the embodiments of the present disclosure, the heat dissipation layer 20 has a small volume and a good heat dissipation effect, which can prolong the service life of the silicon-based OLED display element and achieve the optical characteristics of high-quality display.

For example, as illustrated in FIG. 1 and FIG. 6E, a gate drive circuit 141, a data drive circuit 142, and a pixel circuit 110 are integrated on the silicon-based organic light-emitting display panel 10. For example, the gate drive circuit 141 and the data drive circuit 142 are located in the peripheral region 140 of the silicon-based organic light-emitting display panel 10. The pixel circuit 110 is located in the display region 130 of the silicon-based organic light-emitting display panel 10, and is connected to the display element 410 on the silicon-based organic light-emitting display panel 10, so as to drive the display element 410 to emit light. For example, the flexible printed circuit board 30 is connected to the peripheral region 140 of the display side of the silicon-based organic light-emitting display panel 10 (for example, the upper side of the silicon-based organic light-emitting display panel 10 illustrated in FIG. 1), for example, connected to the gate drive circuit 141 and the data drive circuit 142 located in the peripheral region 140, and is configured to transmit electrical signals to the gate drive circuit 141, the data drive circuit 142, and the second electrode of the display element 410. For example, the gate drive circuit 141 is configured to generate gate driving signals, and the data drive circuit 142 is configured to generate data signals. The gate drive circuit 141, the data drive circuit 142, and the pixel circuit 110 may adopt circuit structures in the art, and the embodiments of the present disclosure are not limited in this aspect.

According to the display device provided by the above embodiments of the present disclosure, on the one hand, in the display device, by setting the heat dissipation layer on the non-display side of the silicon-based organic light-emitting display panel and allowing the heat dissipation layer to extend to the flexible printed circuit board to cover at least a part of the flexible printed circuit board, the heat dissipation of the silicon-based organic light-emitting display panel and the flexible printed circuit board can be realized, thereby preventing the influence of the temperature change of the silicon-based organic light-emitting diode in the silicon-based organic light-emitting display panel due to insufficient heat dissipation on the display brightness and display life of the display device, improving the display quality of the display device, and prolonging the service life of the display device. On the other hand, in the display device, the heat dissipation layer and the silicon-based OLED display device are integrated together, the manufacturing process is simple, the compactness of the display device is improved, and the manufacturing cost of the display device is greatly reduced.

Figure 3:
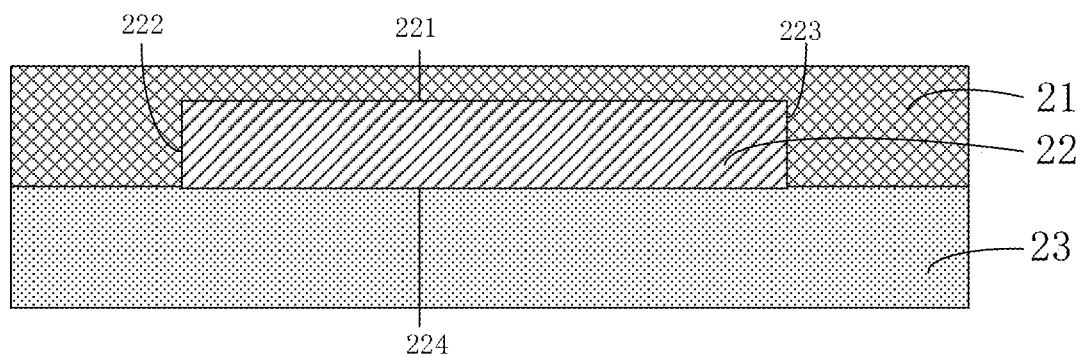
FIG. 3 is a schematic cross-sectional view of a heat dissipation layer provided by at least one embodiment of the present disclosure.

FIG. 3 is a schematic cross-sectional view of a heat dissipation layer provided by at least one embodiment of the present disclosure. As illustrated in FIG. 3, the heat dissipation layer 20 includes a first heat dissipation layer 23, a second heat dissipation layer 22, and a third heat dissipation layer 21.

For example, in some examples, the heat dissipation layer 20 can be directly formed on the silicon-based organic light-emitting display panel 10, and for example, a vapor deposition process or an electroforming method may be used to directly form the first heat dissipation layer 23 on the non-display side of the silicon-based organic light-emitting display panel 10.

For example, the second heat dissipation layer 22 is disposed on a side of the first heat dissipation layer 23 away from the silicon-based organic light-emitting display panel 10. An area of an orthographic projection of the second heat dissipation layer 22 on a plane parallel to the first heat dissipation layer 23 is smaller than an area of an orthographic projection of the first heat dissipation layer 22 on the plane, and the orthographic projection of the second heat dissipation layer 22 on the plane is within the orthographic projection of the first heat dissipation layer 23 on the plane.

For example, the third heat dissipation layer 21 can be disposed on a side of the second heat dissipation layer 22 away from the first heat dissipation layer 23 by using a vapor deposition process or an electroforming method, and the third heat dissipation layer 21 covers all surfaces (e.g., surfaces 221, 222, and 223), that are not in contact with the first heat dissipation layer 23, of the second heat dissipation layer 22, so that the second heat dissipation layer 22 can be completely wrapped between the first heat dissipation layer 23 and the third heat dissipation layer 21, so as to improve the heat dissipation effect. For example, the surface in contact with the first heat dissipation layer 23 is 224.

In the embodiments of the present disclosure, the first heat dissipation layer 23 and the third heat dissipation layer 21 are manufactured by using a vapor deposition process or an electroforming method, which can reduce the manufacturing cost of the heat dissipation layer, and the manufacturing process is simple, thereby reducing the complexity of the manufacturing process of the display device.

Figure 4:
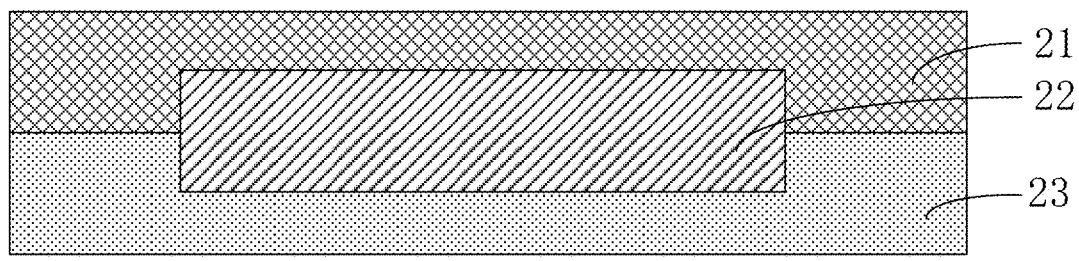
FIG. 4 is a schematic cross-sectional view of another heat dissipation layer provided by at least one embodiment of the present disclosure.

FIG. 4 is a schematic cross-sectional view of another heat dissipation layer provided by at least one embodiment of the present disclosure. For example, the structure of the heat dissipation layer illustrated in FIG. 4 is basically the same as the structure of the heat dissipation layer illustrated in FIG. 3, except that, before the second heat dissipation layer 22 is formed, a groove is etched on the first heat dissipation layer 23, for example, by using a mask, the second heat dissipation layer 22 is formed in the groove, and then the third heat dissipation layer 21 is formed on the side of the second heat dissipation layer 22 away from the first heat dissipation layer 23, and the third heat dissipation layer 21 covers all surfaces, that are not in contact with the first heat dissipation layer 23, of the second heat dissipation layer 22.

It should be noted that the heat dissipation layer 10 may also have other specific structures, as long as the second heat dissipation layer 22 is wrapped between the first heat dissipation layer 23 and the third heat dissipation layer 21, thereby improving the heat dissipation effect.

Figure 5:
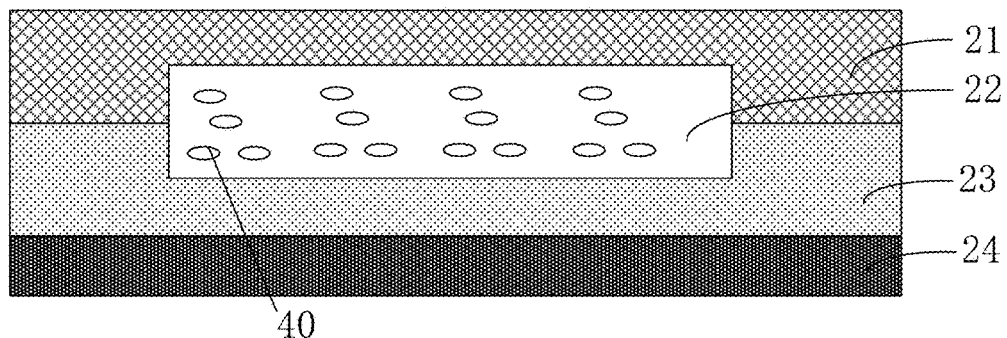
FIG. 5 is a schematic cross-sectional view of still another heat dissipation layer provided by at least one embodiment of the present disclosure.

For example, as illustrated in FIG. 5, a material 40 of the second heat dissipation layer may be metal particles or a phase change material.

For example, in some examples, the metal particles include copper metal particles, copper alloy metal particles, silver metal particles, silver alloy metal particles, aluminum metal particles, or aluminum alloy metal particles, which are not limited in the embodiments of the present disclosure. For example, in an example, the second heat dissipation layer 22 may adopt copper metal particles. It should be noted that the second heat dissipation layer may also adopt a metal layer, as long as the heat dissipation effect of the heat dissipation layer can be improved, and the embodiments of the present disclosure are not limited thereto.

For example, in this example, a thermal conductivity of the second heat dissipation layer 22 is greater than a thermal conductivity of the first heat dissipation layer 23, or the thermal conductivity of the second heat dissipation layer 22 is greater than a thermal conductivity of the third heat dissipation layer 21. For example, the second heat dissipation layer 22 is made of copper metal particles, and the first heat dissipation layer 23 and the third heat dissipation layer 21 are made of other metals with low thermal conductivity and low cost, thereby reducing the cost of the heat dissipation layer without affecting the heat dissipation effect. For example, the second heat dissipation layer 22 may be poor in stability or may be expensive, but has good thermal conductivity, which can improve the heat dissipation effect, and the design based on the first heat dissipation layer 23, the second heat dissipation layer 22, and the third heat dissipation layer 21 can take into account the thermal conductivity, stability, and design cost, thereby reducing the design cost of the heat dissipation layer while improving the heat dissipation effect.

For example, in some examples, the phase change material includes liquid metal. For example, the liquid metal is solid at normal temperature and becomes liquid at high temperature (for example, 60 degrees). The principle of absorbing heat during the conversion process between solid and liquid is used to achieve the effect of temperature reduction, thereby achieving heat dissipation. In addition, in the case where the metal is converted into a liquid state, heat transfer can also be promoted through the flowing process of the liquid metal. For example, in the above embodiments, the second heat dissipation layer 22 is wrapped between the first heat dissipation layer 23 and the third heat dissipation layer 21 to prevent the loss of the liquid metal and ensure the stability of the heat dissipation structure. For example, the temperature for controlling the state transition of the liquid metal is related to the ratio of the materials contained in the liquid metal, and reference may be made to related settings in the art for details, which is not repeated here.

For example, the liquid metal includes alloys of one or more of gallium, indium, rubidium, and cesium, and the embodiments of the present disclosure are not limited thereto.

It should be noted that the phase change material can also be converted from solid to solid, as long as the phase change material can absorb heat during the conversion process and reduce the temperature to achieve the heat dissipation function, and the embodiments of the present disclosure are not limited thereto.

For example, in some examples, a material of the first heat dissipation layer 23 and a material of the third heat dissipation layer 21 are metal. For example, the metal includes copper, copper alloy, silver, silver alloy, aluminum, or aluminum alloy, etc., and the embodiments of the present disclosure are not limited thereto. For example, in an example, the first heat dissipation layer 23 and the third heat dissipation layer 21 may adopt copper foil.

For example, in some other examples, the silicon-based organic light-emitting display panel 10 and the heat dissipation layer 20 may be provided separately. For example, in this example, as illustrated in FIG. 5, the heat dissipation layer 20 includes an adhesive layer 24, so that the heat dissipation layer 20 can be separately manufactured and adhered on the non-display side of the silicon-based organic light-emitting display panel 10. For example, the adhesive layer 24 is between the first heat dissipation layer 23 and the silicon-based organic light-emitting display panel 10 to be adhered to the silicon-based organic light-emitting display panel 10, so as to ensure the stability of the display device 1.

For example, a material of the adhesive layer 24 may be an acrylic pressure-sensitive layer or an organic material having adhesiveness, such as resin, which is not limited in the embodiments of the present disclosure.

FIG. 6A is a schematic diagram of a silicon-based organic light-emitting display panel provided by at least one embodiment of the present disclosure. As illustrated in FIG. 6A, the silicon-based organic light-emitting display panel includes: a silicon substrate 11, a first electrode 13 of a display element, an organic light-emitting layer 14, and a second electrode 15 of the display element.

For example, a gate drive circuit 141, a data drive circuit 142, and a pixel circuit 110 are integrated on the silicon substrate 11, and the flexible printed circuit board 30 is configured to transmit electrical signals to the gate drive circuit 141, the data drive circuit 142, and the second electrode of the display element.

For example, as illustrated in FIG. 6A, the first electrode 13 of the display element is provided on the silicon substrate 11 (not illustrated in the figure) and is connected to the pixel circuit (not illustrated in the figure) integrated on the silicon substrate 11. The organic light-emitting layer 14 is disposed on the side of the first electrode 13 of the display element away from the silicon substrate 11. The second electrode 15 of the display element is disposed on the side of the organic light-emitting layer 14 away from the first electrode 13 of the display element.

For example, the pixel circuit (not illustrated in the figure) is configured to provide a driving current to the first electrode 13 of the display element under control of driving signals, such as a gate scanning signal, a data signal, and voltage signals, so as to enable the organic light-emitting layer 14 to emit light under the action of the electric field between the first electrode 13 of the display element and the second electrode 15 of the display element. For the detailed introduction of the pixel circuit, reference can be made to the description of FIG. 6D below, which is not repeated here. It should be noted that the pixel circuit illustrated in FIG. 6D is only schematic, and the embodiments of the present disclosure are not limited thereto. For example, the pixel circuit may also adopt a pixel circuit including circuit structures in the art, such as 4T1C, 4T2C, 7T1C, 8T2C, etc., and the driving method may adopt methods in the art, which is not repeated here. For example, the pixel circuit may be manufactured on the silicon substrate 11 by using a CMOS process, which is not limited in the embodiments of the present disclosure.

For example, the display element is an OLED display element. For example, the first electrode 13 of the display element is an anode, and the second electrode 15 of the display element is a cathode, for example, grounded. For example, the first electrode 13 of the display element may be made of a transparent metal oxide material including indium tin oxide (ITO) or indium zinc oxide (IZO), which has a high light transmittance. For example, the material of the second electrode 15 of the display element is metal. For example, the metal may be magnesium, magnesium alloy, aluminum, or aluminum alloy.

For example, the organic light-emitting layer 14 may be made of an organic material, and light emission after power-on can be achieved by utilizing the light-emitting characteristics of the organic material.

For example, the silicon-based organic light-emitting display panel 10 further includes: a first thin film encapsulation layer 16, a second thin film encapsulation layer 18, a color film layer 17, and a cover plate 19. For example, the first thin film encapsulation layer 16 and the second thin film encapsulation layer 18 are sequentially disposed on the side of the second electrode 15 of the display element away from the organic light-emitting layer 14; the color film layer 17 is disposed between the first thin film encapsulation layer 16 and the second thin film encapsulation layer 18; and the cover plate 19 is disposed on the side of the second thin film encapsulation layer 18 away from the color film layer 17.

For example, the first thin film encapsulation layer 16 and the second thin film encapsulation layer 18 can realize effective encapsulation of the display element, achieve effective barrier to moisture, oxygen, etc., so as to protect the display element and prolong the service life of the display element. For example, the color film layer 17 includes RGB color film layers and is matched with the organic light-emitting layer 14 respectively. The color film layer 17 is disposed on the first thin film encapsulation layer 16 and is corresponding to the organic light-emitting layer 14, so that the colorful display of the emitted light can be realized.

For example, the second thin film encapsulation layer 18 and the cover plate 19 are sequentially disposed on the color film layer 17, so as to achieve the function of protecting the color film layer 17. For example, the second thin film encapsulation layer 18 is made of one or more of organic materials or inorganic materials with better sealing characteristics, so as to achieve a better sealing effect and protect the silicon-based OLED display element. For example, the cover plate 19 may adopt a transparent material. For example, the transparent material may be an inorganic material, such as glass, or an organic material, such as polyimide. For example, in the embodiments of the present disclosure, plain glass with high transmittance may be used, and the embodiments of the present disclosure are not limited in this aspect.

For example, in some examples, the display device 1 further includes a sealant 12 which is disposed on the side surfaces of the cover plate 19 and connects the cover plate 19 and the silicon substrate 11. The side surfaces of the cover plate 19 and the silicon substrate 11 are sealed with the sealant 12 to block the invasion of water and oxygen in the outside air.

FIG. 6B is a schematic partial cross-sectional view of a silicon-based organic light-emitting display panel provided by at least one embodiment of the present disclosure. The silicon-based organic light-emitting display panel of this embodiment is basically identical to the silicon-based organic light-emitting display panel illustrated in FIG. 6A, except that the structure of the silicon-based organic light-emitting display panel 10 is illustrated in more detail and a plurality of sub-pixels are illustrated. It should be understood that the silicon-based organic light-emitting display panel 10 in this embodiment may be completely identical or substantially identical to the silicon-based organic light-emitting display panel 10 illustrated in FIG. 6A, and the detailed structure of the silicon-based organic light-emitting display panel 10 is not illustrated in FIG. 6A for simplicity of description. Of course, the silicon-based organic light-emitting display panel 10 in this embodiment may be different from the silicon-based organic light-emitting display panel 10 illustrated in FIG. 6A, as long as corresponding functions can be realized. It should be understood that the silicon-based organic light-emitting display panel illustrated in FIG. 6A also includes a plurality of sub-pixels, and the plurality of sub-pixels are not illustrated in FIG. 6A for simplicity of description.

In this embodiment, as illustrated in FIG. 6B, the silicon-based organic light-emitting display panel 10 includes a silicon substrate 11 and a display element 410 (i.e., a light-emitting element). For example, the silicon substrate 11 includes a base substrate 420, a pixel circuit 110, a light reflecting layer 440, and an insulating layer 450 that are sequentially laminated. The display element 410 includes an anode layer 13 (i.e., a first electrode of the display element), an organic light-emitting layer 14, and a cathode layer 15 (i.e., a second electrode of the display element) which are sequentially laminated on the insulating layer 450. The anode layer 13 is a transparent electrode layer. For example, the insulating layer 450 is transparent, so that light emitted from the organic light-emitting layer 14 can pass through and reach the light reflecting layer 440 to be reflected by the light reflecting layer 440.

For example, the insulating layer 450 includes a via hole 452 filled with a metal member 451, and the light reflecting layer 440 is electrically connected to the anode layer 13 through the metal member 451. In this way, by forming a conductive channel between the light reflecting layer 440 and the anode layer 13 in the insulating layer 450, it is advantageous to transmit electrical signals provided by the pixel circuit 110 in the silicon substrate 11 to the anode layer 13 through the light reflecting layer 440. In this way, it not only is advantageous to realize the control of the display element 410 by the pixel circuit 110, but also enables the structure of the silicon-based organic light-emitting display panel to be more compact and is advantageous to the miniaturization of the device. Further, for example, the metal member 451 is manufactured of a metal material, such as tungsten metal, and the via hole filled with the tungsten metal is also referred to as a tungsten via hole. For example, in the case where a thickness of the insulating layer 450 is large, forming the tungsten via hole in the insulating layer 450 can ensure the stability of the conductive path. Moreover, due to the mature process of manufacturing the tungsten via hole, the surface flatness of the obtained insulating layer 450 is good, which is conducive to reducing the contact resistance between the insulating layer 450 and the anode layer 13. It can be understood that the tungsten via hole is not only suitable for realizing electrical connection between the insulating layer 450 and the anode layer 13, but also suitable for electrical connection between the light reflecting layer 440 and the pixel circuit 110, as well as electrical connection between other wiring layers.

For example, the silicon substrate 11 includes the pixel circuit 110, the pixel circuit 110 is electrically connected to the light reflecting layer 440, and the pixel circuit 110 is used to drive the display element 410 to emit light. The pixel circuit 110 includes at least a driving transistor M0 and a switching transistor (not illustrated in the figure), and the driving transistor M0 is electrically connected to the light reflecting layer 440. Thus, the electrical signal for driving the display element 410 can be transmitted to the anode layer 13 through the light reflecting layer 440, thereby controlling the display element 410 to emit light. For example, the driving transistor M0 includes a gate electrode G, a source electrode S, and a drain electrode D. The source electrode S of the driving transistor M0 is electrically connected to the light reflecting layer 440. In the case where the driving transistor M0 is in a turn-on state and in a saturation state, under control of the data voltage applied to the gate electrode, the driving current provided by a power supply line can be transmitted to the anode layer 13 through the source electrode S of the driving transistor M0 and the light reflection layer 440. Because a voltage difference is formed between the anode layer 13 and the cathode layer 15, an electric field is formed between the anode layer 13 and the cathode layer 15, holes and electrons are injected into the organic light-emitting layer 14 and then combined, and thus the organic light-emitting layer 14 emits light under the action of the electric field. It can be understood that in the driving transistor M0, the position of the source electrode S and the position of the drain electrode D may be interchangeable, so that one of the source electrode S and the drain electrode D may be electrically connected to the light reflecting layer 440.

For example, the silicon-based organic light-emitting display panel 10 includes a plurality of sub-pixels (or pixel units), and three sub-pixels are exemplarily illustrated in FIG. 6B, namely, a red sub-pixel SP1, a green sub-pixel SP2, and a blue sub-pixel SP3. Each sub-pixel corresponds to one sub-pixel region of the silicon-based organic light-emitting display panel 10. That is, an independent display element 410 and an independent driving transistor M0 are provided in each sub-pixel.

For example, the insulating layer 450 in the three sub-pixels is integrally formed to facilitate manufacture. For example, as illustrated in FIG. 6B, the insulating layer 450 further includes an opening 454 for exposing a pad 453, and the arrangement of the opening 454 facilitates electrical connection and signal communication between the pad 453 and external circuits. For example, the opening 454 of the pad 453 is located in the peripheral region 140. The colors of sub-pixels in the silicon-based organic light-emitting display panel 10 are only schematic and may also include other colors, such as yellow, white, etc.

For example, as illustrated in FIG. 6B, the silicon-based organic light-emitting display panel 10 further includes a first thin film encapsulation layer 16, a color film layer 17, and a second thin film encapsulation layer 18, which are sequentially disposed on the cathode layer 15. The silicon-based organic light-emitting display panel 10 further includes a cover plate 19 which is disposed on the second thin film encapsulation layer 18. For example, the first thin film encapsulation layer 16 is located on a side of the cathode layer 15 away from the base substrate 420. The color film layer 17 is located on a side of the first thin film encapsulation layer 16 away from the base substrate 420, and includes a red filter unit R, a green filter unit G, and a blue filter unit B. The second thin film encapsulation layer 18 and the cover plate 19 are located on a side of the color film layer 17 away from the base substrate 420. The specific materials of the first thin film encapsulation layer 16, the color film layer 17, the second thin film encapsulation layer 18, and the cover plate 19 may adopt materials in the art, and are not described in detail here.

For example, in the silicon-based organic light-emitting display panel 10 provided by the embodiments of the present disclosure, the display element 410 including the anode layer 13, the organic light-emitting layer 14, and the cathode layer 15, the first thin film encapsulation layer 16, the color film layer 17, the second thin film encapsulation layer 18, and the cover plate 19 can be manufactured separately from the silicon substrate 11. In addition, in the same process, the insulating layer 450 above the pad 453 is also etched, thereby exposing the pad 453, so as to perform a FPC bonding between the pad 453 and a flexible printed circuit board or a wire bonding between the pad 453 and a wire. Therefore, in the embodiments of the present disclosure, the silicon substrate 11 including the light reflecting layer 440 and the insulating layer 450 and suitable for forming the display element 410 can be manufactured by a wafer fab, which not only lowers the manufacturing difficulty of the light reflecting layer 440, but also facilitates the subsequent process performed by the panel factory.

FIG. 6C is a schematic diagram of a circuit principle of a silicon-based organic light-emitting display panel provided by at least one embodiment of the present disclosure. The silicon-based organic light-emitting display panel includes a plurality of display elements L located in the display region 130 (active area, AA) and pixel circuits 110 coupled to respective display elements L in one-to-one correspondence, and the pixel circuit 110 includes a driving transistor. Moreover, the silicon-based organic light-emitting display panel may further include a plurality of voltage control circuits 20 located in the non-display region (the region other than the display region 130 in the silicon-based organic light-emitting display panel) of the silicon-based organic light-emitting display panel. For example, at least two pixel circuits 110 in a same row share one voltage control circuit 120, and first electrodes of driving transistors in a same row of pixel circuits 110 is coupled to the shared voltage control circuit 120, and second electrodes of respective driving transistors are coupled to corresponding display elements L. The voltage control circuit 120 is configured to output an initialization signal Vinit to the first electrodes of the driving transistors in response to a reset control signal RE, so as to control the reset of the corresponding display elements L, and is configured to output a first power supply signal VDD to the first electrodes of the driving transistors in response to a light emission control signal EM, so as to drive the display elements L to emit light. By sharing the voltage control circuit 120, the structure of respective pixel circuits in the display region 130 can be simplified, and an occupied region of the pixel circuits in the display region 130 can be reduced, so that the display region 130 can be provided with more pixel circuits and display elements, and an organic light-emitting display panel with high PPI can be realized. In addition, the voltage control circuit 120 outputs the initialization signal Vinit to the first electrodes of the driving transistors under the control of the reset control signal RE to control the reset of the corresponding display elements, thereby avoiding the influence of the voltage loaded on the display elements during the light emission of a previous frame on the light emission of a next frame, and further alleviating the afterimage phenomenon.

For example, the silicon-based organic light-emitting display panel may further include a plurality of pixel units PX located in the display region 130, and each pixel unit PX includes a plurality of sub-pixels. Each sub-pixel includes one display element L and one pixel circuit 110, respectively. Further, the pixel unit PX may include 3 sub-pixels of different colors. The three sub-pixels may be a red sub-pixel, a green sub-pixel, and a blue sub-pixel. Of course, the pixel unit PX may also include 4, 5 or more sub-pixels, which needs to be designed and determined according to the actual application environment, and is not limited here.

For example, pixel circuits 110 in at least two adjacent sub-pixels in the same row may share one voltage control circuit 120. For example, in some examples, as illustrated in FIG. 6C, all pixel circuits 110 in the same row may share one voltage control circuit 120. Alternatively, in some other examples, pixel circuits 110 in two, three or more adjacent sub-pixels in the same row may share one voltage control circuit 120, which is not limited here. In this way, the occupied region of the pixel circuits in the display region 130 can be reduced by sharing the voltage control circuit 120.

FIG. 6D is a circuit diagram of a specific implementation example of a voltage control circuit and a pixel circuit of a silicon-based organic light-emitting display panel provided by at least one embodiment of the present disclosure. For example, a driving transistor M0 in the pixel circuit 110 may be an N-type transistor. In the case where a current flows from a first terminal S of the driving transistor M0 to a second terminal D of the driving transistor M0, the first terminal S may serve as a source electrode of the driving transistor M0 and the second terminal D may serve as a drain electrode of the driving transistor M0. In the case where a current flows from the second terminal D to the first terminal S, the second terminal D may serve as the source electrode of the driving transistor M0 and the first terminal S may serve as the drain electrode of the driving transistor M0. Also, the display element L may include an OLED. Thus, an anode of the OLED is electrically connected to the second terminal D of the driving transistor M0, and a cathode of the OLED is electrically connected to a second power supply terminal VSS. The voltage of the second power supply terminal VSS is generally a negative voltage or a ground voltage VGND (generally 0 V), and the voltage of the initialization signal Vinit may also be set to the ground voltage VGND, which is not limited here. For example, the OLED can be set as a Micro-OLED or a Mini-OLED, which is further beneficial to realizing the organic light-emitting display panel with high PPI.

For example, taking two pixel circuits 110 included in a same row as an example, the voltage control circuit 120 may include a first switching transistor M1 and a second switching transistor M2. A gate electrode of the first switching transistor M1 is used for receiving the reset control signal RE, a first electrode of the first switching transistor M1 is used for receiving the initialization signal Vinit, and a second electrode of the first switching transistor M1 is coupled to the first electrode S of the corresponding driving transistor M0. A gate electrode of the second switching transistor M2 is used for receiving the light emission control signal EM, a first electrode of the second switching transistor M2 is used for receiving the first power supply signal VDD, and a second electrode of the second switching transistor M2 is coupled to the first electrode S of the corresponding driving transistor M0.

For example, the type of the first switching transistor M1 and the type of the second switching transistor M2 may be different. For example, the first switching transistor M1 is an N-type transistor and the second switching transistor M2 is a P-type transistor. Alternatively, the first switching transistor M1 is a P-type transistor and the second switching transistor M2 is an N-type transistor. Of course, the first switching transistor M1 and the second switching transistor M2 may be of the same type. In actual application, the types of the first switching transistor M1 and the second switching transistor M2 need to be designed according to the actual application environment, which are not limited here.

For example, the pixel circuit 110 may further include a third switching transistor M3 and a storage capacitor Cst. For example, a gate electrode of the third switching transistor M3 is used to receive a first gate scanning signal S1, a first electrode of the third switching transistor M3 is used to receive a data signal DA, and a second electrode of the third switching transistor M3 is coupled to the gate electrode G of the driving transistor M0. A first terminal of the storage capacitor Cst is coupled to the gate electrode G of the driving transistor M0, and a second terminal of the storage capacitor Cst is coupled to the ground terminal GND.

For example, the pixel circuit 110 may further include a fourth switching transistor M4. For example, a gate electrode of the fourth switching transistor M4 is used to receive a second gate scanning signal S2, a first electrode of the fourth switching transistor M4 is used to receive the data signal DA, and a second electrode of the fourth switching transistor M4 is coupled to the gate electrode G of the driving transistor M0. Furthermore, the fourth switching transistor M4 and the third switching transistor M3 are of different types. For example, the third switching transistor M3 is an N-type transistor and the fourth switching transistor M4 is a P-type transistor. Alternatively, the third switching transistor M3 is a P-type transistor and the fourth switching transistor M4 is an N-type transistor.

It should be noted that in the case where the voltage of the data signal DA is a voltage corresponding to a high gray scale, the fourth switching transistor M4, for example, of the P type, is turned on to transmit the data signal DA to the gate electrode G of the driving transistor M0, so that the voltage of the data signal DA can be prevented from being influenced by a threshold voltage of the third switching transistor M3, for example, of the N type. In the case where the voltage of the data signal DA is a voltage corresponding to a low gray scale, the third switching transistor M3, for example, of the N type, is turned on to transmit the data signal DA to the gate electrode G of the driving transistor M0, so that the voltage of the data signal DA can be prevented from being influenced by a threshold voltage of the fourth switching transistor M4, for example, of the P type. In this way, the voltage range input to the gate electrode G of the driving transistor M0 can be improved.

The driving transistor M0, the first switching transistor M1, the second switching transistor M2, the third switching transistor M3, and the fourth switching transistor M4 are MOS transistors manufactured in the silicon substrate.

Figure 7:
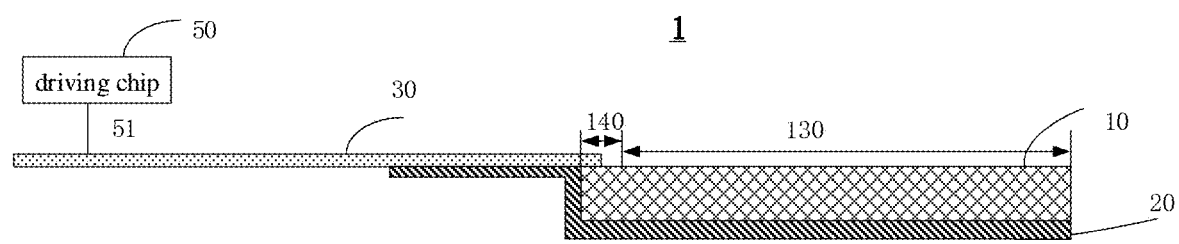
FIG. 7 is a schematic cross-sectional view of another display device provided by at least one embodiment of the present disclosure.

FIG. 7 is a schematic cross-sectional view of another display device provided by at least one embodiment of the present disclosure. As illustrated in FIG. 7, on the basis of the example illustrated in FIG. 1, the display device 1 further includes a driving chip 50. For example, the driving chip 50 is connected to the flexible printed circuit board 30 and is configured to provide driving signals to the silicon-based organic light-emitting display panel 10. For example, the driving chip 50 is located in the bonding region of the display device 1, and is connected to the flexible printed circuit board 30 through signal lines 51, so as to provide the driving signals (e.g., the clock signal, the initialization signal Vinit, the first power supply signal VDD, the second power supply signal VSS, the image data, etc.) to the gate drive circuit, the data drive circuit, the pixel circuit, etc. in the silicon-based OLED display substrate through the flexible printed circuit board 30.

It should be noted that, for clarity and conciseness, the embodiments of the present disclosure do not illustrate all the constituent units of the display device. In order to realize the basic functions of the display device, those skilled in the art may provide and set other structures not illustrated according to specific needs, and the embodiments of the present disclosure are not limited in this aspect.

According to the display device provided by the above embodiments of the present disclosure, on the one hand, in the display device, by setting the heat dissipation layer on the non-display side of the silicon-based organic light-emitting display panel and allowing the heat dissipation layer to extend to the flexible printed circuit board to cover at least a part of the flexible printed circuit board, the heat dissipation of the silicon-based organic light-emitting display panel and the flexible printed circuit board can be realized, thereby preventing the influence of the temperature change of the silicon-based organic light-emitting diode in the silicon-based organic light-emitting display panel due to insufficient heat dissipation on the display brightness and display life of the display device, improving the display quality of the display device, and prolonging the service life of the display device. On the other hand, in the display device, the heat dissipation layer and the silicon-based OLED display device are integrated together, the manufacturing process is simple, the compactness of the display device is improved, and the manufacturing cost of the display device is greatly reduced.

At least one embodiment of the present disclosure further provides a heat dissipation layer. The heat dissipation layer includes: a first heat dissipation layer, a second heat dissipation layer, and a third heat dissipation layer. For example, the heat dissipation layer can be used for heat dissipation of the display device, and the embodiments of the present disclosure are not limited thereto.

For example, the second heat dissipation layer is disposed on the side of the first heat dissipation layer away from the silicon-based organic light-emitting display panel, and an area of an orthographic projection of the second heat dissipation layer on a plane parallel to the first heat dissipation layer is less than an area of an orthographic projection of the first heat dissipation layer on the plane, and the orthographic projection of the second heat dissipation layer on the plane is within the orthographic projection of the first heat dissipation layer on the plane.

For example, the third heat dissipation layer is disposed on the side of the second heat dissipation layer away from the first heat dissipation layer, and covers all surfaces, that are not in contact with the first heat dissipation layer, of the second heat dissipation layer, so that the second heat dissipation layer is completely wrapped between the first heat dissipation layer and the third heat dissipation layer, so as to improve the heat dissipation effect.

For example, for the specific structure of the heat dissipation layer, reference may be made to the descriptions of FIG. 3, FIG. 4, and FIG. 5, which is not repeated here.

Figure 8:
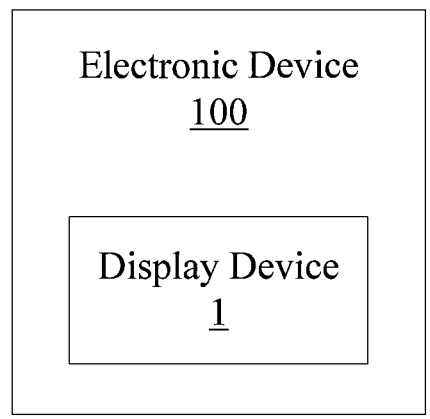
FIG. 8 is a schematic diagram of an electronic device provided by at least one embodiment of the present disclosure.

At least one embodiment of the present disclosure also provides an electronic device. FIG. 8 is a schematic diagram of an electronic device provided by at least one embodiment of the present disclosure. As illustrated in FIG. 8, an electronic device 100 includes the display device 1 provided by any embodiment of the present disclosure, for example, the display device 1 illustrated in FIG. 1 or FIG. 7. For example, the electronic device 100 may be a virtual reality device or an augmented reality device.

For example, the display device 1 may be a silicon-based OLED display device, which is not limited in the embodiments of the present disclosure.

It should be noted that, for clarity and conciseness, the embodiments of the present disclosure do not illustrate all the constituent units of the electronic device 100. In order to realize the basic functions of the electronic device 100, those skilled in the art may provide and set other structures not illustrated according to specific needs, which are not limited in the embodiments of the present disclosure.

For the technical effect of the electronic device 100 provided by the above embodiments of the present disclosure, reference may be made to the technical effect of the display device provided by the embodiments of the present disclosure, which is not repeated here.

Figure 9:
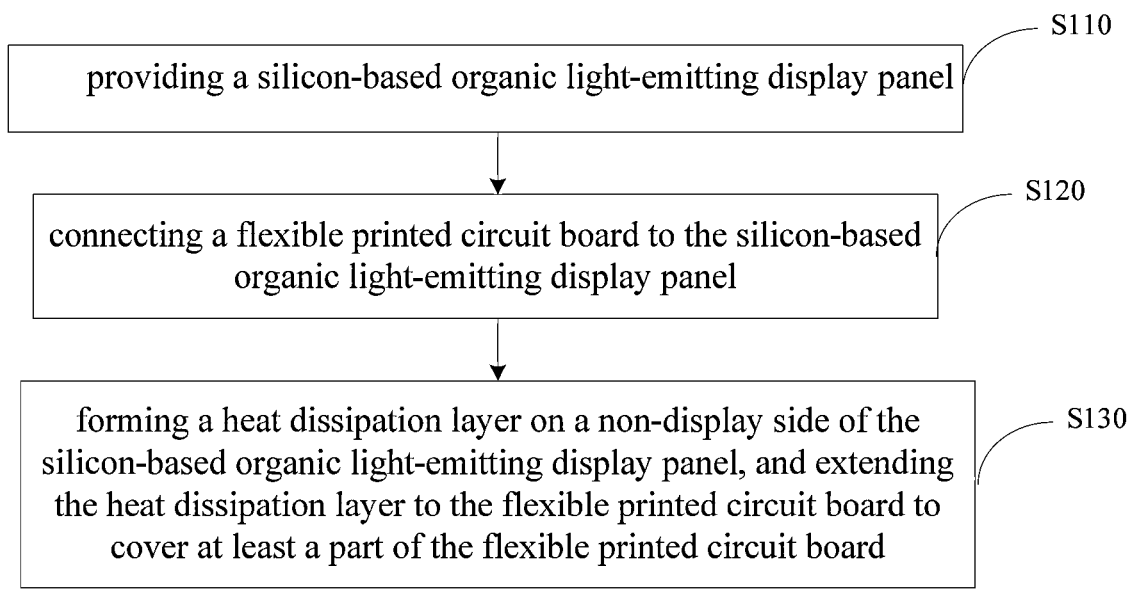
FIG. 9 is a flowchart of a method for manufacturing a display device provided by at least one embodiment of the present disclosure.

At least one embodiment of the present disclosure also provides a method for manufacturing a display device. FIG. 9 is a flowchart of a method for manufacturing a display device provided by at least one embodiment of the present disclosure. For example, the method can be used to manufacture the display device provided by any embodiment of the present disclosure. For example, the method can be used to manufacture the display substrate illustrated in FIG. 1. As illustrated in FIG. 9, the method for manufacturing the display device includes steps S110-S130.

Step S110: providing a silicon-based organic light-emitting display panel.

Step S120: connecting a flexible printed circuit board to the silicon-based organic light-emitting display panel.

Step S130: forming a heat dissipation layer on a non-display side of the silicon-based organic light-emitting display panel, and extending the heat dissipation layer to the flexible printed circuit board to cover at least a part of the flexible printed circuit board.

It should be noted that in step S110, providing the silicon-based organic light-emitting display panel refers to forming an organic light-emitting device or other necessary display elements for display on a side of a silicon substrate. However, the order of forming the organic light-emitting diode or other necessary display elements for display and forming the heat dissipation layer in step 130 is not particularly limited and can be selected according to actual situation. For example, the organic light-emitting diode or other necessary display elements for display can be formed first, and then the heat dissipation layer is formed; or the heat dissipation layer is formed on the silicon substrate first, and then the organic light-emitting diode or other necessary display elements for display are formed.

For step S110, for example, the silicon-based organic light-emitting display panel 10 may adopt the structure illustrated in FIG. 6A, and the structure may be formed by using a conventional method in the art, which is not repeated here. The embodiments of the present disclosure are not limited in this aspect.

For step S120, for example, the flexible printed circuit board 30 is connected to the peripheral region 140 of the display side of the silicon-based organic light-emitting display panel 10 (for example, the upper side of the silicon-based organic light-emitting display panel 10 illustrated in FIG. 1), for example, connected to the gate drive circuit 141 and the data drive circuit 142 in the peripheral region 140, so as to be configured to transmit electrical signals to the gate drive circuit 141, the data drive circuit 142, and the second electrode of the display element 410. For example, the gate drive circuit 141 is used to generate gate driving signals, and the data drive circuit 142 is used to generate data signals. The gate drive circuit 141, the data drive circuit 142, and the pixel circuit 110 may adopt conventional circuit structures in the art, which are not limited in the embodiments of the present disclosure.

For step S130, for example, in an example, the heat dissipation layer 20 may be directly formed on the non-display side of the silicon-based organic light-emitting display panel 10 by using a specific process, and the heat dissipation layer 20 extends to the flexible printed circuit board 30 to cover at least a part of the flexible printed circuit board 30. In some other examples, the heat dissipation layer 20 may be formed separately first, and then is adhered to the non-display side of the silicon-based organic light-emitting display panel 10, and the heat dissipation layer 20 may be extended to the flexible printed circuit board 30 to cover at least a part of the flexible printed circuit board 30. For example, as illustrated in FIG. 1 or FIG. 2, the heat dissipation layer 20 extends from the non-display side of the silicon substrate 11 to cover at least 30% of the area of the flexible printed circuit board 30, so that the heat dissipation of the silicon-based organic light-emitting display panel 10 can be realized as well as the heat dissipation of the flexible printed circuit board 30 is realized, and the heat dissipation effect of the display device is improved.

For example, in some examples, as illustrated in FIG. 1, the silicon-based organic light-emitting display panel 10 includes a display region 130 and a peripheral region 140 surrounding the display region 130. The display region 130 includes a plurality of display devices for display. For example, as illustrated in FIG. 6F, an orthographic projection 211 of the heat dissipation layer 20 on a plane parallel to the silicon-based organic light-emitting display panel 10 at least partially overlaps with an orthographic projection of the display region 130 on the plane. For example, a width of the flexible printed circuit board 30 is smaller than a width of the silicon substrate 11, and thus, for example, as illustrated in FIG. 6F, the orthographic projection of the heat dissipation layer 20 on the plane is narrower than the orthographic projection of the silicon-based organic light-emitting display panel 10 on the plane.

For example, the position of the heat dissipation layer 20 corresponds to the silicon-based organic light-emitting display panel 10 and the flexible printed circuit board 30, and the heat dissipation layer 20 is integrated or adhered under the silicon-based organic light-emitting display panel 10 and the flexible printed circuit board 30, so that the effective heat dissipation of the silicon-based OLED display panel 10 and the flexible printed circuit board 30 can be realized. For example, the size of the heat dissipation layer 20 is slightly smaller than the size of the silicon-based OLED display panel 10 and the flexible printed circuit board 30, so that the influence of the large size of the heat dissipation layer 20 on the size of the display device 1 can be avoided, which may limit the application scenario thereof. In the embodiments of the present disclosure, the heat dissipation layer 20 has a small volume and a good heat dissipation effect, which can prolong the service life of the silicon-based OLED display device and achieve the optical characteristics of high-quality display.

For example, in some examples, step S130 includes: forming a first heat dissipation layer 23 on the non-display side of the silicon-based organic light-emitting display panel 10 by using an evaporation process or an electroforming method; forming a second heat dissipation layer 22 on the first heat dissipation layer 23, an orthographic projection of the second heat dissipation layer 22 on a plane parallel to the first heat dissipation layer 23 being smaller than an orthographic projection of the first heat dissipation layer 23 on the plane; and forming a third heat dissipation layer 21 on the second heat dissipation layer 22 by using the evaporation process or the electroforming method, and allowing the third heat dissipation layer 21 to cover all surfaces, that are not in contact with the first heat dissipation layer 23, of the second heat dissipation layer 22. For example, the second heat dissipation layer 22 can be manufactured by the corresponding process according to the material of the second heat dissipation layer 22, which may not be repeated in the embodiments of the present disclosure.

For example, in the embodiments of the present disclosure, the first heat dissipation layer 23 and the second heat dissipation layer 22 are manufactured by using an evaporation process or an electroforming method, which can reduce the manufacturing cost of the heat dissipation layer, the manufacturing process is simple, and the complexity of the manufacturing process of the display device is reduced.

For example, the manufacturing of the heat dissipation layer 20 can be achieved based on a mask process. For example, the first heat dissipation layer 23 is formed based on a first opening of a mask, the second heat dissipation layer 22 is formed based on a second opening, and the third heat dissipation layer 21 is formed based on a third opening. For example, the area of the first opening and the area of the third opening are both larger than the area of the second opening, and the area of the first opening and the area of the third opening are equal. For the specific operation method of the masking process, reference may be made to related settings in the art, which is not repeated here, and the embodiments of the present disclosure are not limited in this aspect.

For example, in some other examples, in the case where the heat dissipation layer 20 is separately formed, step S130 may further include: forming an adhesive layer 24 on the first heat dissipation layer 23, so as to be adhered with the non-display side of the silicon-based organic light-emitting display panel 10 that is separately formed.

For example, the material of the adhesive layer 24 may be an acrylic pressure-sensitive film layer or an organic material having adhesiveness such as resin, which is not specifically limited in the embodiments of the present disclosure.

For example, for the description of the heat dissipation layer, reference may be made to the introduction of FIGS. 3-5, which is not repeated here.

It should be noted that in various embodiments of the present disclosure, the process of the method for manufacturing the display device may include more or fewer operations, and these operations may be performed sequentially or in parallel. Although the process of the method described above includes operations occurring in a specific order, it should be clearly understood that the order of the operations is not limited. The method described above can be performed once or can be performed multiple times according to predetermined conditions.

For the technical effect of the method for manufacturing the display device provided by the above embodiments, reference may be made to the technical effect of the display device provided by the embodiments of the present disclosure, which is not repeated here.

The following statements need to be noted.

(1) The drawings of the embodiments of the present disclosure involve only the structures related to the embodiments of the present disclosure, and other structures may be referred to general design.

(2) In case of no conflict, the embodiments of the present disclosure and the features in the embodiments can be combined with each other to obtain new embodiments.

What have been described above merely are specific implementations of the present disclosure, but the protection scope of the present disclosure is not limited to this. The protection scope of the present disclosure is determined by the appended claims.

What is claimed is:

1. A display device, comprising:
a silicon-based organic light-emitting display panel, comprising a silicon substrate, a first electrode of a display element, an organic light-emitting layer, and a second electrode of the display element that are stacked sequentially;
a flexible printed circuit board electrically connected to the silicon substrate; and
a heat dissipation layer on a non-display side of the silicon-based organic light-emitting display panel, extending to the flexible printed circuit board to cover at least a part of the flexible printed circuit board,
wherein a gate drive circuit, a data drive circuit, and a pixel circuit are integrated on the silicon substrate, and the flexible printed circuit board is configured to transmit electrical signals to the gate drive circuit, the data drive circuit, and the second electrode of the display element, wherein the heat dissipation layer comprises:
a first heat dissipation layer on the non-display side of the silicon-based organic light-emitting display panel;

a second heat dissipation layer on a side of the first heat dissipation layer away from the silicon-based organic light-emitting display panel, wherein an area of an orthographic projection of the second heat dissipation layer on a plane parallel to the first heat dissipation layer is smaller than an area of an orthographic projection of the first heat dissipation layer on the plane, and the orthographic projection of the second heat dissipation layer on the plane is within the orthographic projection of the first heat dissipation layer on the plane; and a third heat-dissipation layer on a side of the second beat dissipation layer away from the first heat dissipation layer, and covering all surfaces, that are not in contact with the first heat dissipation layer, of the second heat dissipation layer, wherein a thermal conductivity of the second heat dissipation layer is greater than a thermal conductivity of the first heat dissipation layer, or the thermal conductivity of the second heat dissipation layer is greater than a thermal conductivity of the third heat dissipation layer.

2. The display device according to claim 1, wherein a material of the second heat dissipation layer is metal particles or a phase change material.

3. The display device according to claim 2, wherein the metal particles comprise copper metal particles, copper alloy metal particles, silver metal particles, silver alloy metal particles, aluminum metal particles, or aluminum alloy metal particles.

4. The display device according to claim 2, wherein the phase change material comprises liquid metal.

5. The display device according to claim 4, wherein the liquid metal comprises alloys of one or more selected from the group consisting of gallium, indium, rubidium, and cesium.

6. The display device according to claim 1, wherein a material of the first heat dissipation layer and a material of the second heat dissipation layer are metal.

7. The display device according to claim 6, wherein the metal comprises copper, copper alloy, silver, silver alloy, aluminum, or aluminum alloy.

8. The display device according to claim 1, wherein the heat dissipation layer further comprises an adhesive layer between the first heat dissipation layer and the silicon-based organic light-emitting display panel.

9. The display device according to claim 1, wherein the flexible printed circuit board comprises a first surface and a second surface that are opposite to each other, an end portion of the first surface of the flexible printed circuit board is connected to a display side of the silicon-based organic light-emitting display panel, and the heat dissipation layer extends to a portion, which is not connected to the silicon-based organic light-emitting display panel, of the first surface of the flexible printed circuit board via a side wall of the silicon-based organic light-emitting display panel.

10. The display device according to claim 1, wherein the heat dissipation layer extends from a non-display side of the silicon substrate to cover at least 30% of an area of the flexible printed circuit board.

11. The display device according to claim 1, wherein the silicon-based organic light-emitting display panel comprises a display region and a peripheral region surrounding the display region, and the display element is in the display region; and an orthographic projection of the heat dissipation layer on a plane parallel to the silicon-based organic light-emitting display panel at least partially overlaps with an orthographic projection of the display region on the plane.

12. The display device according to claim 11, wherein a width of the flexible printed circuit board is smaller than a width of the silicon substrate.

13. The display device according to claim 1, wherein the silicon-based organic light-emitting display panel further comprises:

a first thin film encapsulation layer and a second thin film encapsulation layer that are sequentially arranged on a side of the second electrode of the display element away from the organic light-emitting layer, a color film layer between the first thin film encapsulation layer and the second thin film encapsulation layer; and a cover plate on a side of the second thin film encapsulation layer away from the color film layer.

14. An electronic device, comprising the display device according to claim 1, wherein the electronic device is a virtual reality device or an augmented reality device.

15. A heat dissipation layer, comprising:

a first heat dissipation layer;

a second heat dissipation layer on the first heat dissipation layer, wherein an area of an orthographic projection of the second heat dissipation layer on a plane parallel to the first heat dissipation layer is smaller than an area of an orthographic projection of the first heat dissipation layer on the plane, and the orthographic projection of the second heat dissipation layer on the plane is within the orthographic projection of the first heat dissipation layer on the plane; and a third heat dissipation layer on a side of the second heat dissipation layer away from the first heat dissipation layer, and covering all surfaces, that are not in contact with the first heat dissipation layer, of the second heat dissipation layer, wherein a thermal conductivity of the second heat dissipation layer is greater than a thermal conductivity of the first heat dissipation layer, or the thermal conductivity of the second heat dissipation layer is greater than a thermal conductivity of the third heat dissipation layer.

16. The heat dissipation layer according to claim 15, wherein a material of the second heat dissipation layer is metal particles or a phase change material.

17. A method for manufacturing a display device, comprising:

providing a silicon-based organic light-emitting display panel;

connecting a flexible printed circuit board to the silicon-based organic light-emitting display panel; and forming a heat dissipation layer on a non-display side of the silicon-based organic light-emitting display panel, and extending the heat dissipation layer to the flexible printed circuit board to cover at least a part of the flexible printed circuit board, wherein the forming the heat dissipation layer on the non-display side of the silicon-based organic light-emitting display panel, and the extending the heat dissipation layer to the flexible printed circuit board to cover at least the pan of the flexible printed circuit board comprises:

forming a first heat dissipation layer on the non-display side of the silicon-based organic light-emitting display panel by using an evaporation process or an electroforming method;

forming a second heat dissipation layer on the first heat dissipation layer, wherein an orthographic projection of the second heat dissipation layer on a plane parallel to the first heat dissipation layer is smaller than an orthographic projection of the first heat dissipation layer on the plane; and forming a third heat dissipation layer on the second heat dissipation layer by using the evaporation process or the electroforming method, and allowing the third heat dissipation layer to cover all surfaces, that are not in contact with the first heat dissipation layer, of the second heat dissipation layer, wherein a thermal conductivity of the second heat dissipation layer is greater than a thermal conductivity of the first heat dissipation layer, or the thermal conductivity of the second heat dissipation layer is greater than a thermal conductivity of the third heat dissipation layer.

* * * * *